(12) United States Patent
Kim

(10) Patent No.: US 7,122,419 B2
(45) Date of Patent: Oct. 17, 2006

(54) CAPACITOR AND FABRICATION METHOD THEREOF

(75) Inventor: Jung Joo Kim, Kyunggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/327,991

(22) Filed: Dec. 26, 2002

(65) Prior Publication Data

US 2004/0077141 A1 Apr. 22, 2004

(30) Foreign Application Priority Data

Oct. 17, 2002 (KR) .................. 10-2002-0063500

(51) Int. Cl.
*H01L 21/8234* (2006.01)

(52) U.S. Cl. .................. 438/238; 438/240; 438/250; 438/253

(58) Field of Classification Search ........ 438/238–256, 438/381–399
See application file for complete search history.

(56) References Cited

U.S. PATENT DOCUMENTS

| 5,851,896 A | * | 12/1998 | Summerfelt | ............... 438/396 |
| 6,015,990 A | * | 1/2000 | Hieda et al. | ............... 257/310 |
| 2002/0164852 A1 | * | 11/2002 | Forbes et al. | ............... 438/240 |
| 2002/0190814 A1 | * | 12/2002 | Yamada et al. | ............. 333/187 |

FOREIGN PATENT DOCUMENTS

JP       01218054 A   *   8/1989

* cited by examiner

*Primary Examiner*—H. Jey Tsai
(74) *Attorney, Agent, or Firm*—Bacon & Thomas, PLLC

(57) ABSTRACT

A fabrication of a capacitor in a semiconductor is simplified by using nitrogen plasma in forming an aluminum nitride layer functioning as an insulation layer on the aluminum layer disposed in a capacitor region. Subsequently, a planarized IMD (inter-metal dielectric) layer is obtained, facilitating via etching process.

10 Claims, 5 Drawing Sheets

CAPACITOR AND FABRICATION METHOD THEREOF

FIELD OF THE INVENTION

The present invention relates to a capacitor in a semiconductor device and method for fabricating same; and, more particularly, to a simplified capacitor and a method having a simplified planarization of an IMD (inter-metal dielectric) layer and via etching process fabricating therefor.

BACKGROUND OF THE INVENTION

Integration density of a memory cell in a semiconductor device is on the rise due to growing demands for higher capacity. In case of a memory cell in DRAM, which includes a MOS transistor and a capacitor, higher integration density thereof results in a reduction of capacitor region. Consequently, as the area of the capacitor is reduced, the electrostatic capacity thereof is also reduced.

As current state of the art, $Ta_2O_5$ (tantalum pentaoxide) or $Si_3N_4$ (silicon nitride) has been conventionally used for its high dielectric constant in fabricating capacitors in semiconductors. Recent growth in demands for dielectric material having higher dielectric constant has been reflected in the field of research in developing capacitors yielding high capacitance at a low voltage. In case of DRAM having a high integration density, since it is important to reduce the area of a capacitor, many studies have been done to replace $Ta_2O_5$ and $Si_3N_4$ with materials such as BST (barium strontium titanate), PZT (lead zirconium titanate) and PLZT (lead lanthanum zirconate titanate) having high dielectric constant.

Further, in an effort to increase the integration density, a trench type capacitor is used in DRAM whereas a stack type capacitor is used in system integrated circuits, which has relatively fewer limitations in terms of the area and voltage requirement, compared to DRAM. However, the system integrated circuits require higher standards in quality in uniformity and frequency dependence than that of DRAM.

However, in order to obtain stable characteristics of the capacitor in a device, e.g., a system integrated circuit, rather than having such a highly dielectric material, it is preferable to use silicon oxide or silicon nitride having an adequate dielectric constant, thereby providing chemical stability. Since spatial limitations are less of a concern in the system integrated circuit than DRAM, adjusting the area of the capacitor or the distance between layers thereof can suitably control its capacitance.

FIG. 1 shows a cross-sectional view of a conventional capacitor in a system integrated circuit.

In a typical capacitor structure, as shown in FIG. 1, an aluminum layer 100 and a TiN layer 102 are sequentially deposited and patterned into bottom electrodes on a substrate 98, which includes MOS transistors (not shown) or the like, and an IMD (inter-metal dielectric) layer 104 is formed on the exposed substrate and the TiN layer 102. Thereafter, via holes 106 and 108 are formed, and are then filled with a conductive material, e.g., W.

Subsequently, a metal-insulator-metal (MIM) stack structure is obtained by sequentially depositing bottom metal layers 110 and 112, an insulation layer 114, and a top metal layer 116. The bottom metal layers 110 and 112 are made of about 3000–10000 Å thick Al and about 600 Å thick TiN, respectively, and formed by sputtering. The TiN layer 102, 112 and 116 also serves as anti-reflection layers as well known in the art. The insulation layer 114 is formed of a silicon nitride fabricated by CVD (chemical vapor deposition) and has a thickness of about 300–600 Å. The top metal layer 116 has a thickness of about 1000 Å.

Thereafter, the insulation layer 114 and the TiN layer 116 are photolithographically defined and patterned to form the capacitor forming region, and then the Al layer 110 and the TiN layer 112 are defined and patterned in the same manner described above. Thereafter, a planarized IMD layer 118 is formed on the structure thus treated.

Subsequently, via holes 120 and 122 are formed and then filled with a conductive material, e.g., W, and thereafter first and second metal lines 124-1 and 124-2 are formed on top portions of the via holes 120 and 122.

The conventional capacitor described above suffers from certain drawbacks. First, the capacitor structure requires rather complex film forming and patterning processes and therefore is costly. That is, the structure necessitates the formation of the TiN layer 112 serving as an ARC (anti-reflective coating) layer, $Si_3N_4$ layer 114, and the top capacitor electrode 116.

Consequently, there occurs a great deal of non-uniformity in the thickness of the IMD layers deposited on the capacitor region and the remaining regions, which has an adverse effect on the planarization of the IMD layer and the via etching process. Further, the conventional MIM capacitor structure described above is produced by two etching steps: i.e., one for the layers 116, 114 and the other for the layer 112, thus generating a step between the layers 112 and 114 at which etching residues may be collected, which in turn contributes to the generation of leakage current and deteriorates the characteristics of the capacitor.

SUMMARY OF THE INVENTION

It is, therefore, a primary object of the present invention to provide a simplified capacitor and fabrication method thereof, wherein a dielectric layer of the capacitor is provided by way of nitrifying an aluminum layer serving as a bottom electrode thereof.

Another object of the present invention is to provide a capacitor and manufacturing method therefor capable of facilitating the planarization of an IMD layer and via etching by minimizing a height difference between a capacitor region and the remaining regions in a semiconductor device.

Still another object of the present invention is to provide a capacitor and fabrication method thereof capable of reducing a leakage current of the structure.

In accordance with one aspect of the invention, there is provided a method for fabricating a capacitor in a semiconductor device, including the steps of: (a) depositing an Al layer serving as one electrode of the capacitor on a substrate; (b) treating the Al layer with nitrogen plasma to form an aluminum nitride layer serving as a capacitor dielectric thereon; (c) patterning the aluminum nitride layer; (d) forming a TiN layer serving as the other electrode of the capacitor on the patterned aluminum nitride layer; and (e) patterning the Al layer, the aluminum nitride layer, and the TiN layer to form the capacitor.

In accordance with another aspect of the invention, there is provided a capacitor for use in a semiconductor device, including: an Al layer serving as an electrode of the capacitor; an aluminum nitride layer formed on the Al layer, aluminum in the aluminum nitride layer being originated from the Al layer; and a TiN layer serving as the other electrode of the capacitor formed on the aluminum nitride layer.

BRIEF DESCRIPTION OF THE DRAWINGS

The above and other objects and features of the present invention will become apparent from the following description of the preferred embodiment given in conjunction with the accompanying drawings, in which.

DETAILED DESCRIPTION OF THE PREFERRED EMBODIMENTS

Figure 2:
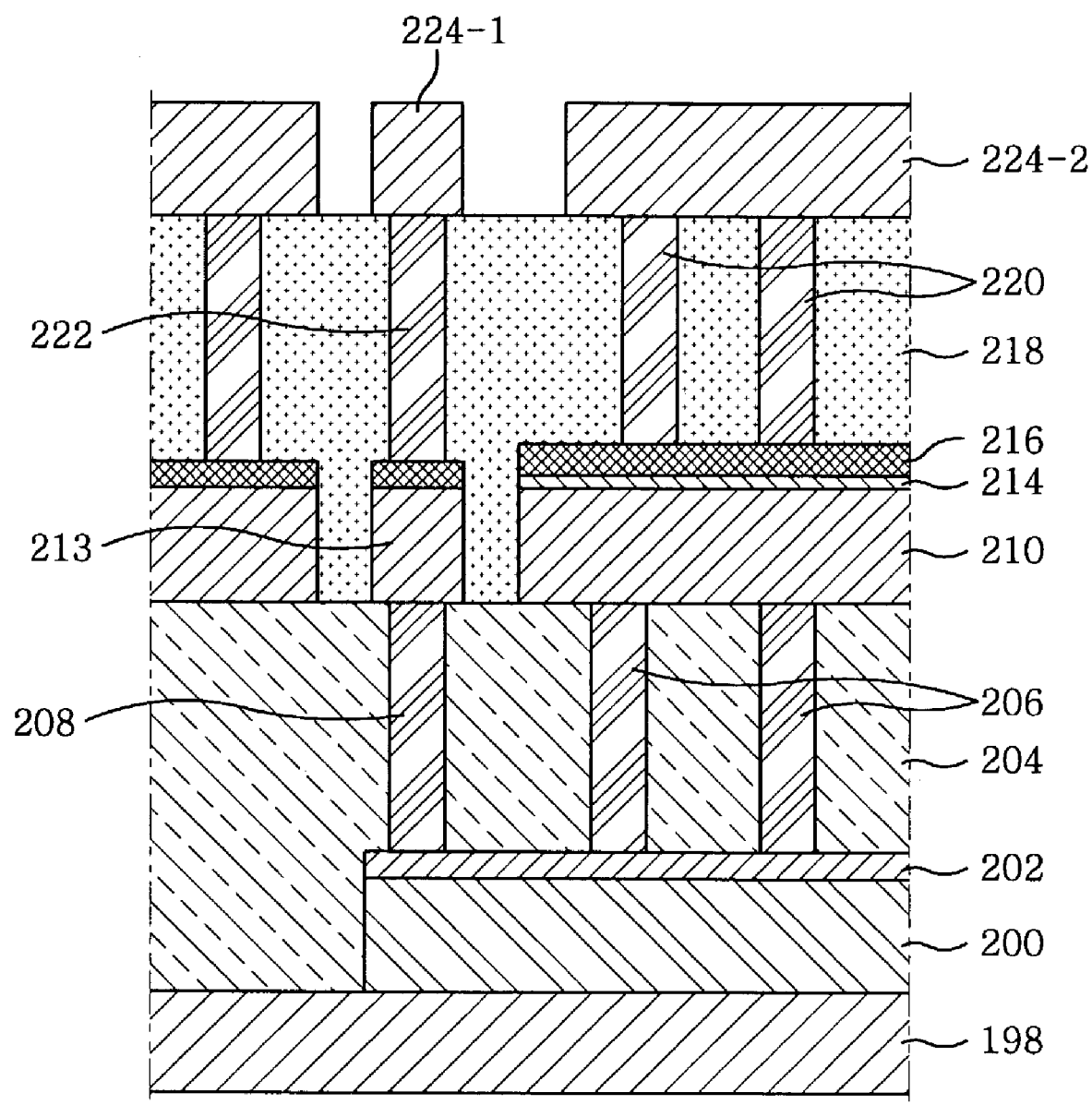
FIG. 2 describes a cross sectional view of a capacitor of a semiconductor device in accordance with the present invention.

In FIG. 2, reference numeral 198 represents a substrate; 200 and 210, Al layers; 214, an aluminum nitride layer; 202 and 216, TiN layers; 206, 208, 220 and 222, via holes; 204 and 218, IMD layers; 224-1 and 224-2, first and second metal lines; and 213, an intermediate metal layer formed of Al, respectively.

Figure 3A:
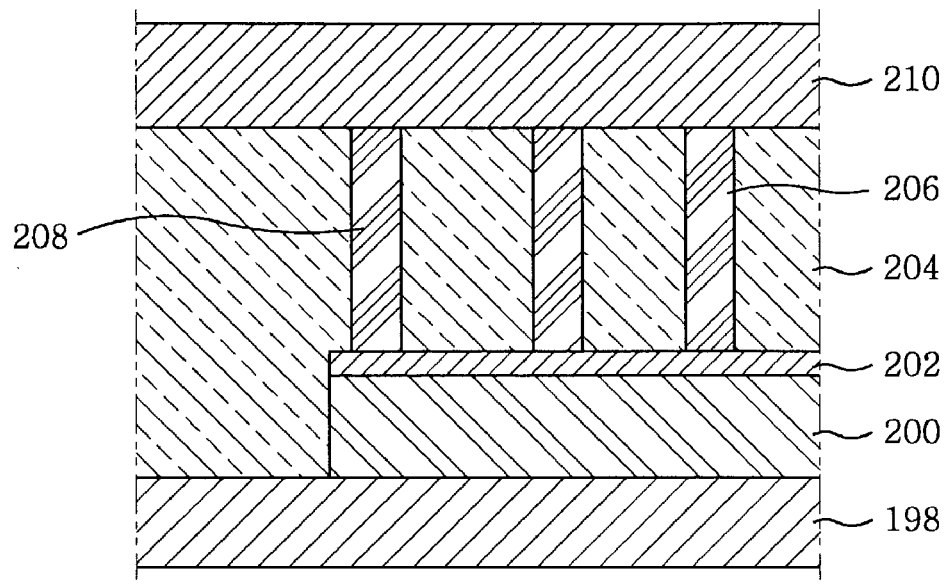
FIGS. 3A to 3F illustrate a capacitor fabricating sequence in accordance with the preferred embodiment of the present invention.

First, as shown in FIG. 3A, the Al layer 200 and the TiN layer 202 are sequentially deposited on the substrate 198 by using, e.g., sputtering and patterned, which includes MOS transistors (not shown) or the like. Subsequently, the IMD layer 204 is formed to cover the patterned Al layer 200 and the TiN layer 202, and the exposed surface of the substrate 198 and is then planarized. Thereafter, via holes 206 and 208 are formed in the IMD layer 204 to expose portions of the TiN layer 202, and are then filled with an electrically conductive material such as W to form plugs therein. Then, the Al layer 210 serving as a bottom electrode of a capacitor to be formed is deposited on the IMD layer 204 and the via holes 206 and 208 by, e.g., sputtering, wherein the thickness of the Al layer 210 is about 3,000–10,000 Å.

Figure 3B:
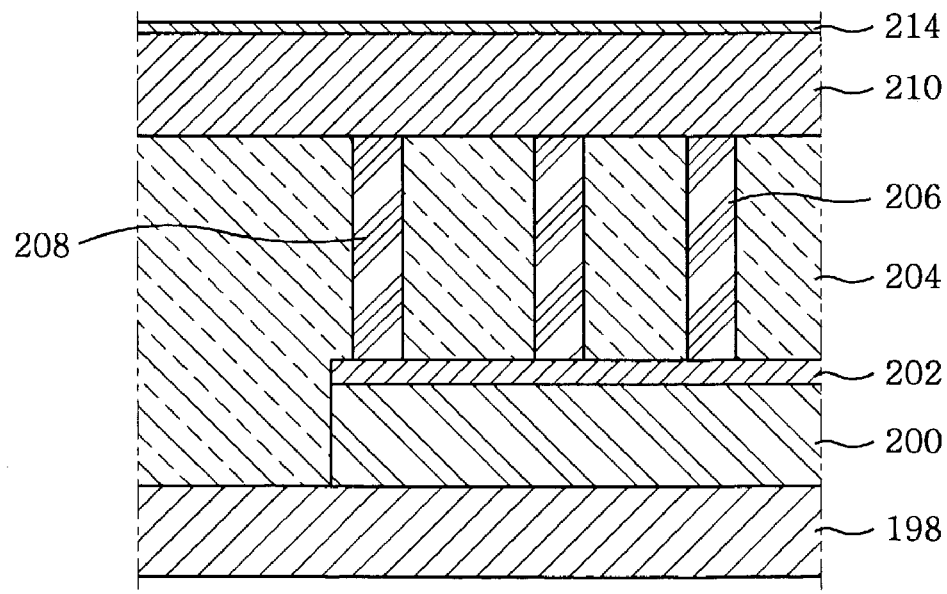

Next, as shown in FIG. 3B, the aluminum nitride layer 214 functioning as a dielectric of the capacitor is formed by nitrifying the Al layer 210 by using, e.g., plasma, wherein the aluminum nitride layer 214 preferably has a thickness of about 50–200 Å. Such plasma can be generated by supplying a RF plasma chamber (not shown) with a $N_2/H_2$, $N_2$ or $NH_3$ gas. The RF power input to the plasma is established at about 200–1,000 W, since a power greater than that may result in the sputtering of the Al layer 210. In addition, a flow rate of the source gas of the plasma is preferably lower than or equal to about 1000 sccm, and in case of using a combination of $N_2$ and $H_2$, the ratio of $N_2$ to $H_2$ is preferably about 1.2–10:1.

In lieu of plasma, however, a RTP (rapid thermal processing), a furnace annealing, or a sputtering can also be used to form the aluminum nitride layer 214 under a $N_2$ atmosphere.

Figure 3C:
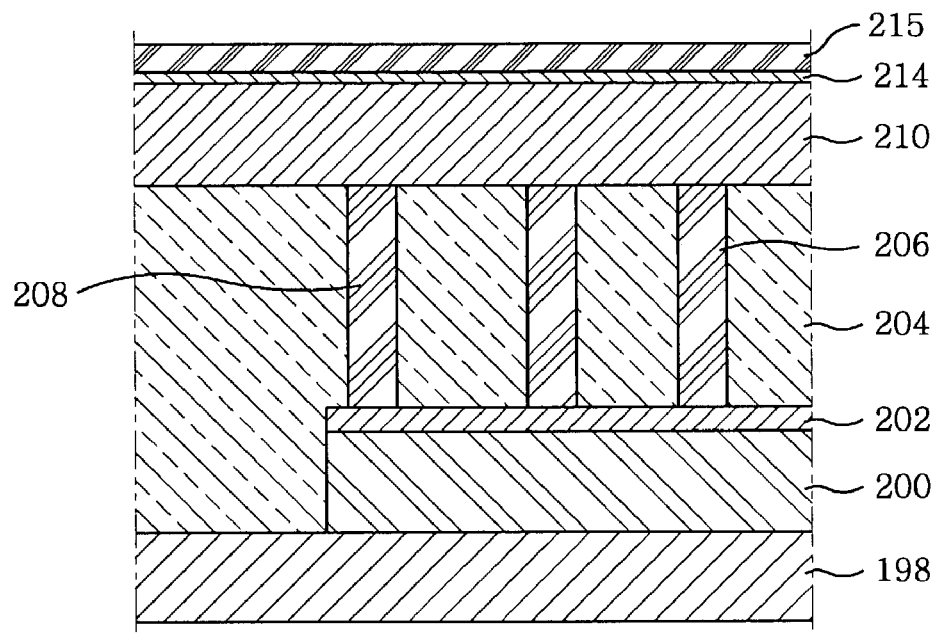

As shown in FIG. 3C, a photoresist layer 215 is then formed on top of the aluminum nitride layer 214, and photolithographically patterned.

Thereafter, the aluminum nitride layer 214 disposed on the non-capacitor region is removed by performing a wet etching or a dry etching such as a plasma etching, using the patterned photoresist layer as a mask. Next, the patterned photoresist layer 215 used as the etching mask of the aluminum nitride layer 214 is removed, thereby obtaining a patterned aluminum nitride layer as shown in FIG. 3D.

Figure 3D:
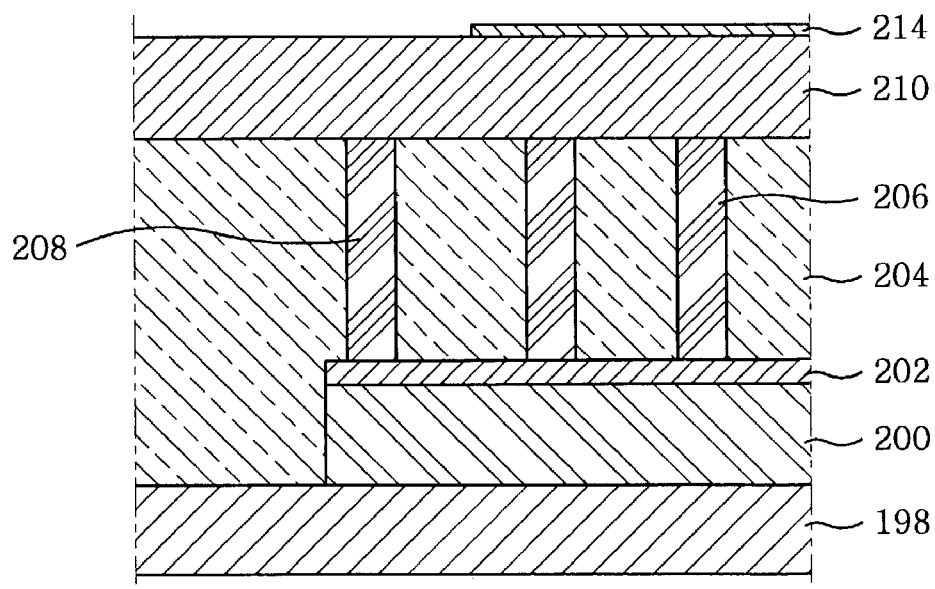

Alternative to the processes employed in FIGS. 3B to 3D, a photolithographically patterned photoresist layer may be formed first on the aluminum layer 210, exposing only the Al layer 210 corresponding to the capacitor region. Subsequently, after subjecting the exposed Al layer 210 to a nitrogen plasma treatment, the photoresist layer is removed, thereby obtaining the patterned aluminum nitride layer 214 in the capacitor region as shown in FIG. 3D.

Figure 3E:
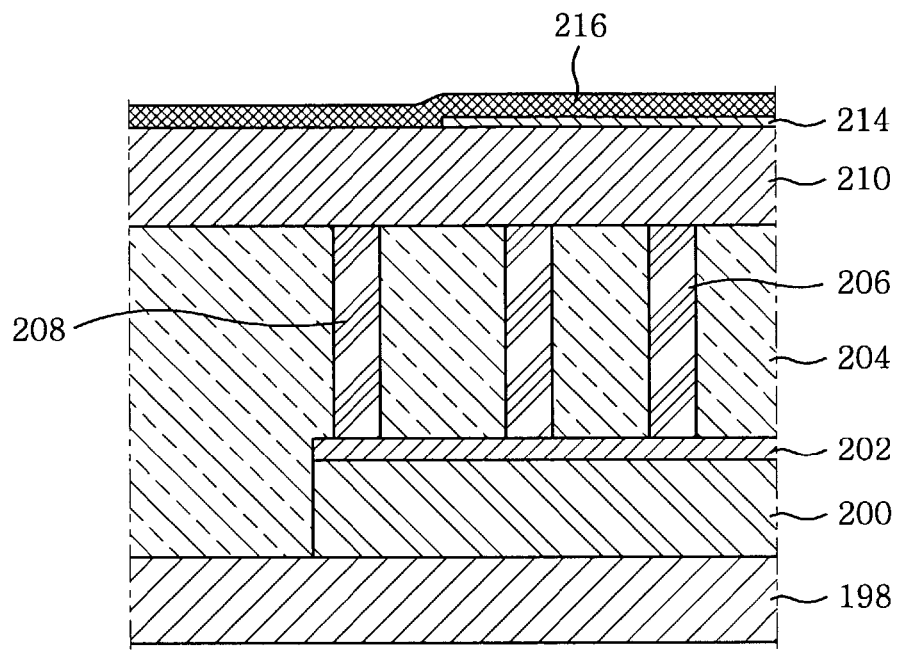

Thereafter, as shown in FIG. 3E, the TiN layer 216 is deposited on both the exposed aluminum layer 210 and the aluminum nitride layer 214, which functions as a top electrode and an anti-reflective coating (ARC) in the capacitor region and as an ARC in the non-capacitor region. The TiN layer 216 is formed by using a PVD (physical vapor deposition) method, e.g., sputtering, and have a thickness of about 600–1,000 Å.

Figure 3F:
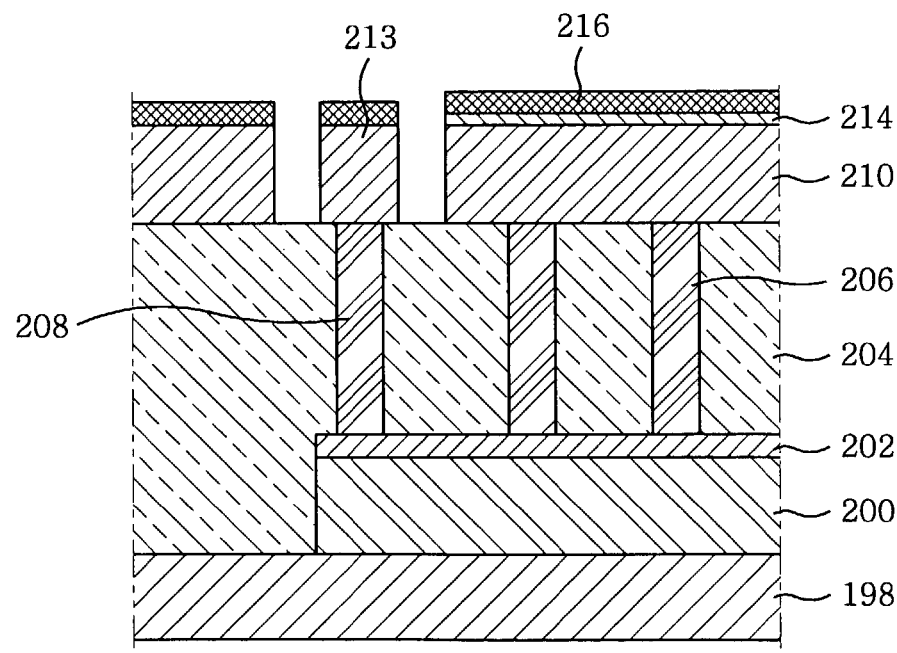

Subsequently, as shown in FIG. 3F, the TiN layer 216, the aluminum nitride layer 214, and the Al layer 210 are photolithographically defined and patterned down to the IMD layer 104, thus separating the capacitor forming region from an intermediate metal layer 213. In this step, the TiN layer 216 (serving as the capacitor upper electrode), the aluminum nitride layer 214 (serving as the capacitor dielectric) and the Al layer (serving as the capacitor lower electrode) are processed in one etching step, rendering no stepped portion between the capacitor dielectric and an electrode layer (in contrast with the conventional capacitor structure shown in FIG. 1).

Thereafter, referring back to FIG. 2, the IMD layer 218 is formed to cover the capacitor forming region and the remaining regions, and is then planarized. Then, via holes 220 and 222 are formed within the IMD layer 218 to expose a top portion of the TiN layer 216, and are filled with a conductive material, e.g., W, to form plugs for the interconnection between the upper and the lower layers thereof.

Finally, the first and second metal lines 224-1 and 224-2 made of, e.g., Al are formed on top of the via holes 220 and 222, which completes the formations of the capacitor structure. The first metal line 224-1 is electrically connected to the bottom capacitor electrode 210 through via hole 222, TiN layer 216, the intermediate metal layer 213, the via holes 208, the TiN layer 202 and finally the via holes 206 in sequence, whereas the second metal line 224-2 is connected to the top capacitor electrode 216 through the via hole 220.

Figure 1:
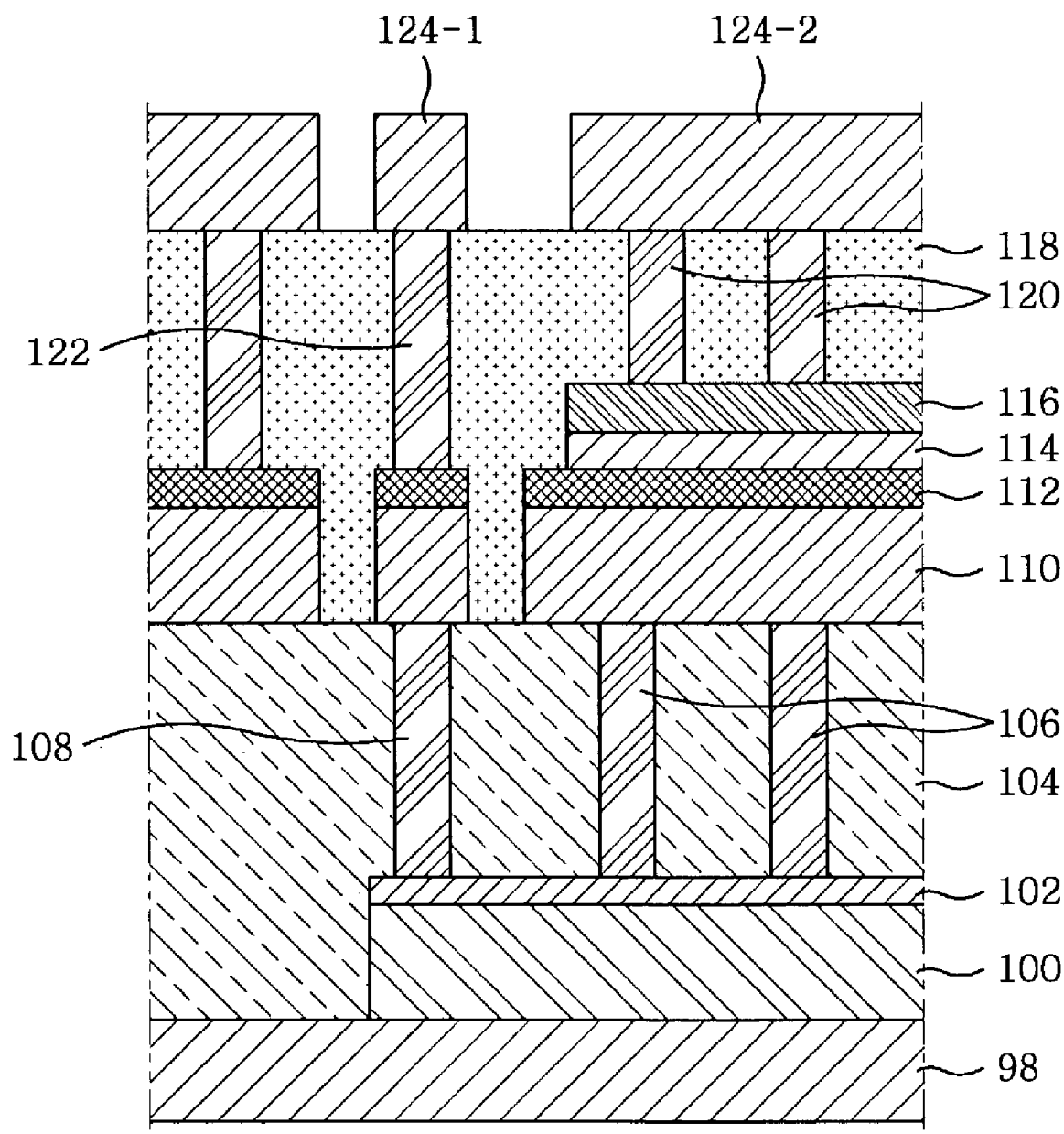
FIG. 1 shows a cross sectional view of a conventional capacitor of a semiconductor device.

In accordance with the present invention, the capacitor is fabricated by a simple process, wherein the conventional lower TiN layer 112 shown in FIG. 1 is eliminated and the capacitor dielectric layer 214 is obtained by way of nitrifying the Al layer serving as the lower electrode of the capacitor with nitrogen plasma, which can function as a good insulator even with a smaller thickness compared to silicon nitride due to its higher dielectric constant. Therefore, in the present invention, a height difference between the capacitor region and the remaining regions can be reduced, thereby facilitating the formation of the IMD layer and preventing a difficulty in via etching.

Further, since the MIM capacitor in accordance with the present invention has no stepped portion, etch residues generated after etching the capacitor can be reduced, thereby lowering or eliminating leakage current.

While the invention has been shown and described with respect to the preferred embodiment, it will be understood by those skilled in the art that various changes and modifications may be made without departing from the spirit and scope of the invention as defined in the following claims.

What is claimed is:

1. A method for fabricating a capacitor in a semiconductor device, comprising the steps of:
    (a) depositing an Al layer serving as a lower electrode of the capacitor on a substrate;
    (b) treating said Al layer with nitrogen to form an aluminum nitride layer at an upper portion of said Al layer, wherein a thickness of the aluminum nitride layer is $\frac{1}{200}$ to $\frac{1}{15}$ of thickness of said Al layer;
    (c) patterning said aluminum nitride layer by removing said aluminum nitride layer disposed on a non-capacitor region; and
    (d) depositing an upper electrode of the capacitor on the patterned aluminum nitride layer.

2. A method for fabricating a capacitor according to claim 1, wherein said Al layer has a thickness of about 3,000–10,000 Å.

3. A method for fabricating a capacitor according to claim 1, wherein the aluminum nitride layer has a thickness of about 50–200 Å.

4. A method for fabricating a capacitor according to claim 1, wherein the upper electrode is a TiN layer and the TiN layer has a thickness of about 600–1,000 Å.

5. A method for fabricating a capacitor according to claim 1, wherein the step (b) is performed by treating the aluminum layer with nitrogen plasma.

6. A method for fabricating a capacitor according to claim 1, wherein the upper electrode comprises a transition metal selected from the group consisting of tungsten, molybdenum and tantalum.

7. A method for fabricating a capacitor according to claim 1, wherein the upper electrode comprises a nitride of refractory metal selected from the group consisting of titanium, zirconium, chromium and hafnium.

8. A method for fabricating a capacitor according to claim 1, wherein the upper electrode is a TiN layer.

9. A method for fabricating a capacitor according to claim 1, wherein the upper electrode is a Ti/TiN layer.

10. A method for fabricating a capacitor according to claim 1, wherein the aluminum layer has a thickness of about 3,000–10,000 Å, the aluminum nitride layer has a thickness of about 50–200 Å and the upper electrode is a TiN layer and the TiN layer has a thickness of about 600–1,000 Å.

* * * * *